United States Patent
Rudberg

(10) Patent No.: US 6,351,227 B1
(45) Date of Patent: Feb. 26, 2002

(54) A/D CONVERSION OFFSET ERROR CORRECTION

(75) Inventor: Mikael Karlsson Rudberg, Linköping (SE)

(73) Assignee: Telefonaktiebolaget LM Ericsson, Stockholm (SE)

(*) Notice: Subject to any disclaimer, the term of this patent is extended or adjusted under 35 U.S.C. 154(b) by 0 days.

(21) Appl. No.: 09/576,837

(22) Filed: May 22, 2000

(30) Foreign Application Priority Data

May 25, 1999 (SE) .............................................. 9901888

(51) Int. Cl.⁷ ................................................ H03M 1/06
(52) U.S. Cl. ........................................ 341/118; 341/155
(58) Field of Search ................................. 341/118, 155

(56) References Cited

U.S. PATENT DOCUMENTS

| | | | |
|---|---|---|---|
| 4,766,417 A | * 8/1988 | Takayama et al. | 341/118 |
| 4,968,988 A | 11/1990 | Miki et al. | 341/141 |
| 4,972,189 A | * 11/1990 | Polito et al. | 341/118 |
| 5,111,203 A | 5/1992 | Calkins | 341/141 |
| 5,153,593 A | 10/1992 | Walden et al. | 341/143 |
| 5,465,092 A | * 11/1995 | Mayes et al. | 341/118 |
| 5,585,796 A | 12/1996 | Svensson et al. | 341/155 |
| 5,798,724 A | 8/1998 | Myers | 341/146 |
| 6,177,893 B1 | * 1/2001 | Velazquez et al. | 341/118 |
| 6,278,391 B1 | * 8/2001 | Walker | 341/118 |

OTHER PUBLICATIONS

Gunnarsson, L.; International–Type Search Report; Search Request No. SE99/00771; App. No. SE9901888–9; Feb. 17, 2000, pp. 1–2.

Farieta, A., International Search Report on International Application No. PCT/SE00/00973, Jun. 18, 2000, pp. 1–3.

* cited by examiner

Primary Examiner—Trong Phan
(74) Attorney, Agent, or Firm—Jenkens & Gilchrist, P.C.

(57) ABSTRACT

An A/D conversion offset error correction arrangement includes an A/D converters (10) for converting analog signals into digital signals. A decoder (12) decodes the digital signals into binary signals. A converter (20) converts the binary signals into equivalent decoded digital signals. Means (16, 18, 24) are provided for forming an offset error estimate by averaging the difference between the digital signals and the decoded digital signals. An adder (26) subtracts the offset error estimate from future digital signals before these signals are decoded.

16 Claims, 11 Drawing Sheets

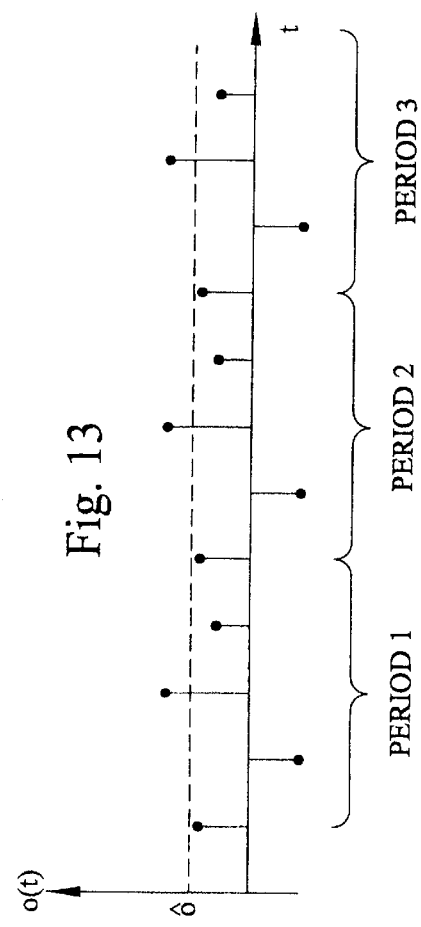
Fig. 13
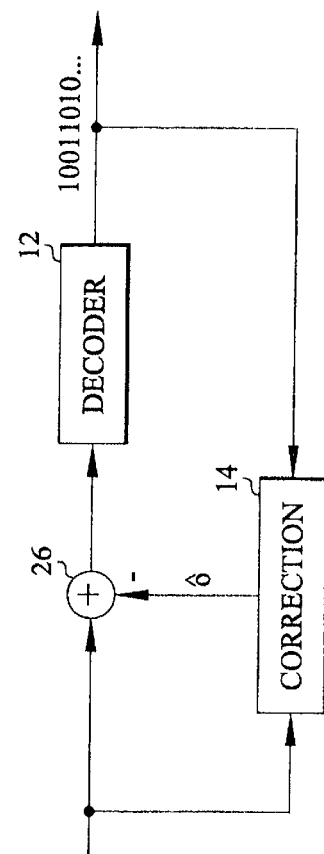
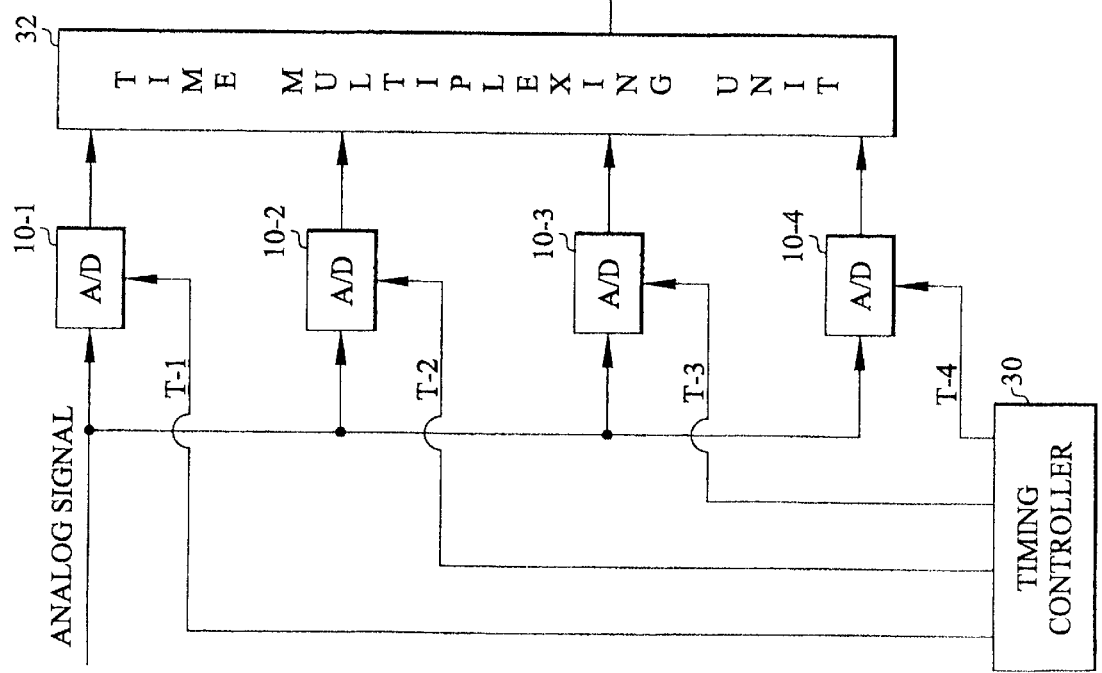
Fig. 14

A/D CONVERSION OFFSET ERROR CORRECTION

TECHNICAL FIELD

The present invention relates generally to A/D conversion, and in particular to a method and arrangement for A/D conversion offset error correction and to an A/D conversion offset error compensated decoding method and arrangement.

BACKGROUND

An A/D converter typically has a resolution of 10–14 bits. However, not all of these bits are valid, since there normally is a zero offset error in the range of 4–6 times the least significant bit. This offset error typically varies rather slowly over time and may, in a first approximation, be considered as a constant that characterizes the A/D converter and differs from one converter to another. A problem caused by this offset error is that it may lead to incorrect decoding of bits or symbols in decoders if the noise level is sufficiently high.

SUMMARY

An object of the present invention is to provide an A/D conversion offset error correction method and arrangement that estimate the offset error and subtract it from the A/D converted signal before this signal is decoded.

Another object of the present invention is to provide an A/D conversion offset error compensated decoding method and arrangement.

These object is solved in accordance with the attached patent claims.

Briefly, the present invention is based on the observation that the decoding process itself may be used to determine the offset error. By subtracting a digital signal that is equivalent to the decoded signal from the A/D converted signal, the remaining digital signal will only contain the offset error and noise. If this signal over is averaged time, the noise will average to zero, and only an estimate of the offset will remain. By subtracting this offset estimate from future A/D converted signals, decoding of this offset corrected signal will be more robust. Alternatively one may say that the SNR (signal to noise ratio) of the decoding process has been increased.

BRIEF DESCRIPTION OF THE DRAWINGS

The invention, together with further objects and advantages thereof, may best be understood by making reference to the following description taken together with the accompanying drawings, in which:

FIG. 13 is a time diagram similar to FIG. 10 illustrating the mean offset error of the digital signal of FIG. 7;

FIG. 14 is a block diagram of still another embodiment of an offset error correction arrangement in accordance with the present invention intended for an interleaved A/D converter;

DETAILED DESCRIPTION

In the following description the same reference designations will be used for equivalent or similar elements throughout the drawings.

Furthermore, the following definitions will be used for the purposes of the following description:

An analog signal is a continuous-time signal having analog values.

A digital signal is a discrete-time signal (samples) having digital values, each represented by more than one bit.

A binary signal is a discrete-time-signal having only binary values (each value being represented by either 0 or 1).

The problem caused by offset errors in connection with decoding will now be described with reference to FIGS. 1–4.

Figure 1:
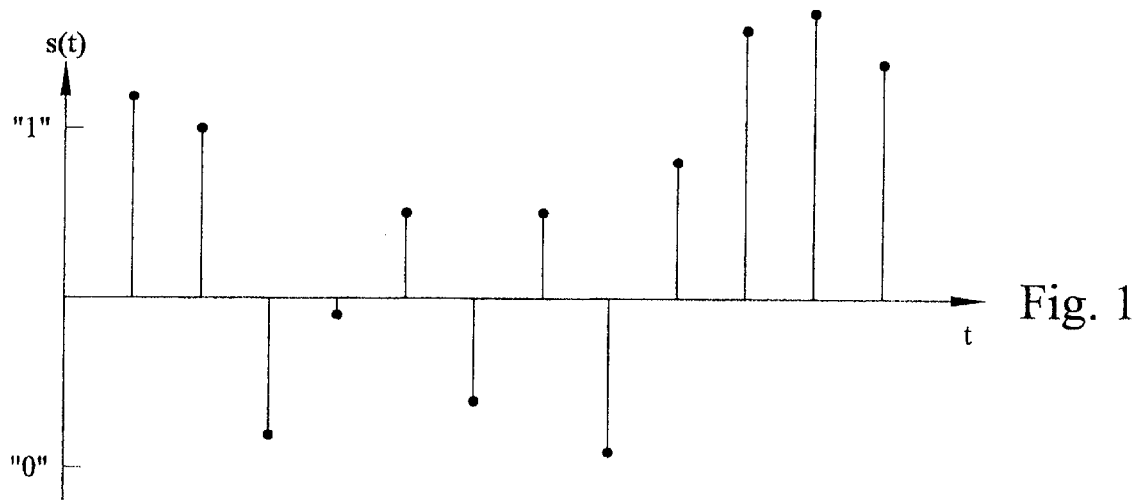
FIG. 1 is a time diagram illustrating an A/D converted digital signal before decoding.

FIG. 1 is a time diagram illustrating an A/D converted digital signal s(t) before decoding. The time axis represents the zero level and is the decision border. Negative samples are decoded to "0" and positive samples are decoded to "1". The digital values corresponding to "0" and "1" have been indicated.

Figure 2:
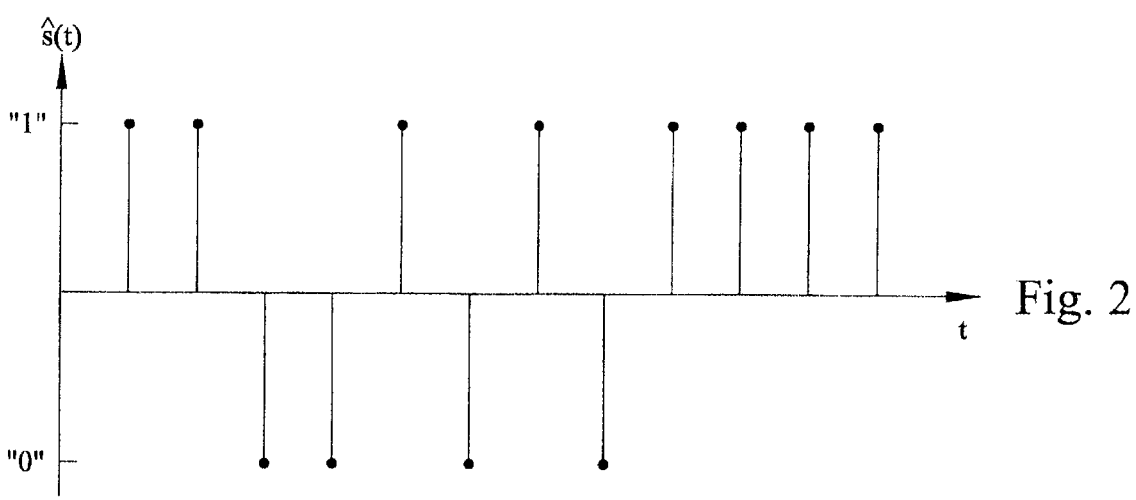
FIG. 2 is a time diagram illustrating the digital signal of FIG. 1 after decoding.

FIG. 2 is a time diagram illustrating the digital signal of FIG. 1 after decoding. The decoded signal ŝ(t) in FIG. 2 represents the decoded sequence 110010101111. What the figure actually shows is not this sequence, but an equivalent sequence of digital samples, where each sample has a value that corresponds to either binary "0" or binary "1".

Figure 3:
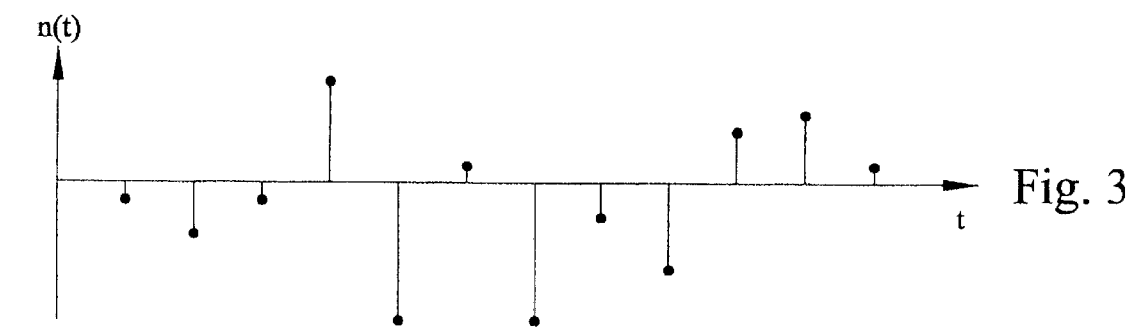
FIG. 3 is a time diagram illustrating the noise part of the digital signal of FIG. 1.

FIG. 3 is a time diagram illustrating the noise part n(t) of the digital signal of FIG. 1. This noise is assumed to be additive white gaussian noise (AWGN).

Figure 4:
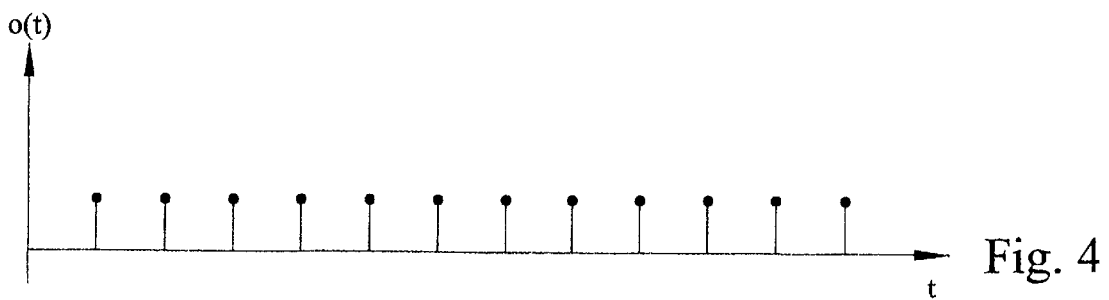
FIG. 4 is a time diagram illustrating the offset error of the digital signal of FIG. 1.

FIG. 4 is a time diagram illustrating the offset error o(t) of the digital signal of FIG. 1. This offset is more or less constant, but varies from A/D converter to A/D converter.

The signal s(t) may thus be written as:

$$s(t) = \hat{s}(t) + n(t) + o(t)$$

By subtracting $\hat{s}(t)$ from s(t) and averaging the difference one obtains:

$$E[e(t)] = E[s(t) - \hat{s}(t)] = E[n(t) + o(t)]$$

If it is assumed that n(t) and o(t) are uncorrelated and that n(t) has an average of zero, one obtains:

$$E[e(t)] = E[n(t)] + E[o(t)] = E[o(t)]$$

Since the offset error is assumed to be approximately constant, one finally obtains a correction estimate:

$$\hat{o} = E[e(t)]$$

This leads to future offset corrected signals:

$$s(t) - \hat{o} = \hat{s}(t) + n(t) + o(t) - \hat{o} \approx \hat{s}(t) + n(t)$$

Thus, the corrected signal will only contain the decoded digital signal and noise.

In most of the embodiments that will be described below an element will be omitted since it is usually not necessary for explaining the principles of the invention. This element is a filter that is provided between the A/D converter and decoder. Such a filter may comprise, for example, a lowpass filter, an equalizer, an echo canceller or a fast Fourier transformer (FFT).

Figure 5:
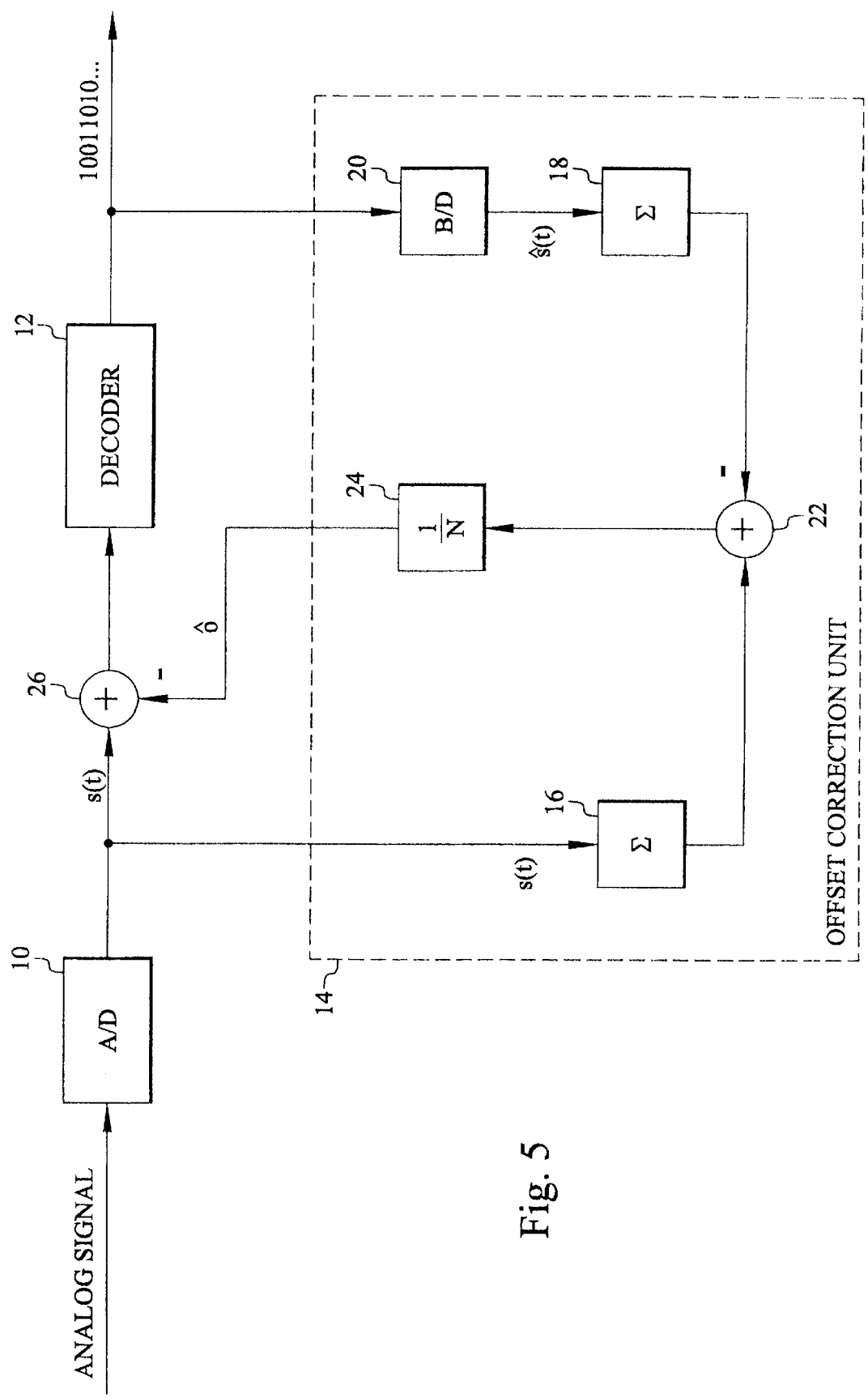
FIG. 5 is a block diagram of an embodiment of an offset error correction arrangement in accordance with the present invention.

FIG. 5 is a block diagram of an embodiment of an offset error correction arrangement in accordance with the present invention. An analog signal is forwarded to an A/D converter 10, which converts the analog signal into a digital signal s(t). This digital signal is decoded into a binary signal in a decoder 12. The arrangement described so far does not have any offset error correction. According to the present invention there is provided an offset correction unit 14. This unit includes two summation units 16 and 18 for summing N samples of the digital signal s(t) and corresponding N samples of the digital representation $\hat{s}(t)$ of the decoded binary signal, respectively. Typically N is a large number, for example $10^4$–$10^6$ (N should be sufficiently large to cancel the noise signal n(t)). A binary-to-digital converter 20 transforms the binary bits from decoder 12 into the equivalent digital representation $\hat{s}(t)$. An adder 22 subtracts the accumulated samples of signal $\hat{s}(t)$ from the accumulated samples of signal s(t). An element 24 divides this difference by N to form the estimated offset correction $\hat{o}$. An adder 26 subtracts the estimated offset correction $\hat{o}$ from future samples of the digital signal s(t) before decoding in decoder 12. The offset error estimation may be repeated periodically to compensate for slow changes in the offset error of D/A converter 10, for example due to temperature changes.

An alternative offset error estimation method continuously updates the estimated offset error using the expression:

$$\hat{o}(t) = \lambda \hat{o}(t-1) + (1-\lambda)e(t)$$

where $\lambda$ is a constant smaller than but close to 1, for example 0.999, and where:

$$e(t) = s(t) - \hat{s}(t)$$

Figure 6:
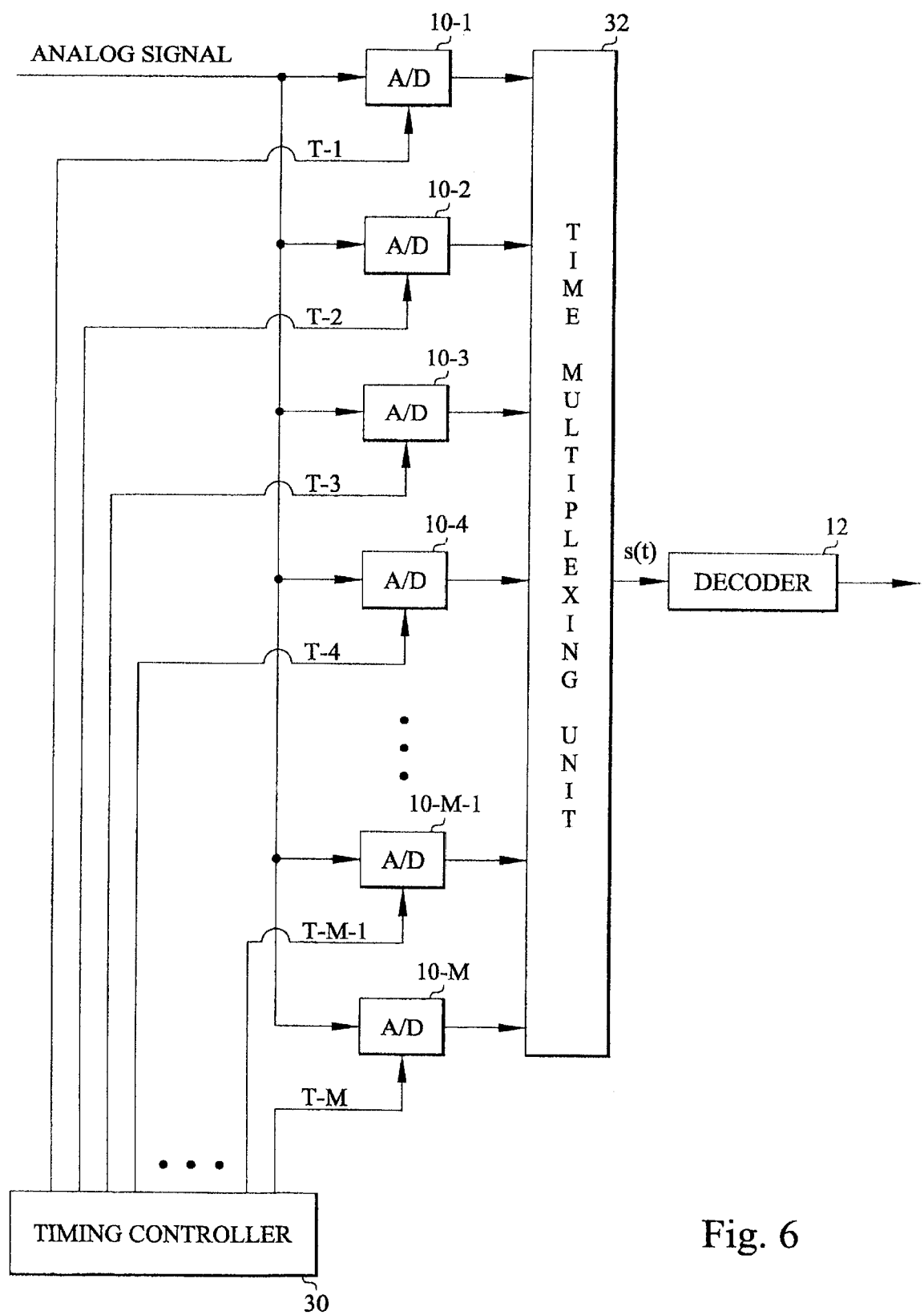
FIG. 6 is a block diagram illustrating an interleaved A/D converter.

FIG. 6 is a block diagram illustrating an interleaved A/D converter. Such an A/D converter includes several A/D converting elements 10-1 . . . 10-M. Each A/D converting element 10-1 . . . 10-M receives the same analog signal, but only one of the elements will convert the signal at a given sampling moment. A timing controller 30 over control lines T-1 . . . T-M controls which A/D converting element 10-1 . . . 10-M that samples and converts the analog signal at a given sampling moment. This is done in a cyclical manner. The result is a set of time interleaved digital samples from the set of A/D converting elements. These digital samples are transformed into a stream of digital samples s(t) by a time multiplexing unit 32. The signal s(t) is forwarded to a decoder 12. The reason for this arrangement is that higher sampling rates can be achieved using slow A/D converters. Further details on interleaved (also called parallel) A/D converters may be found in [1, 2].

The effect on the offset error by an interleaved A/D converter will now be discussed with reference to FIGS. 7–10.

Figure 7:
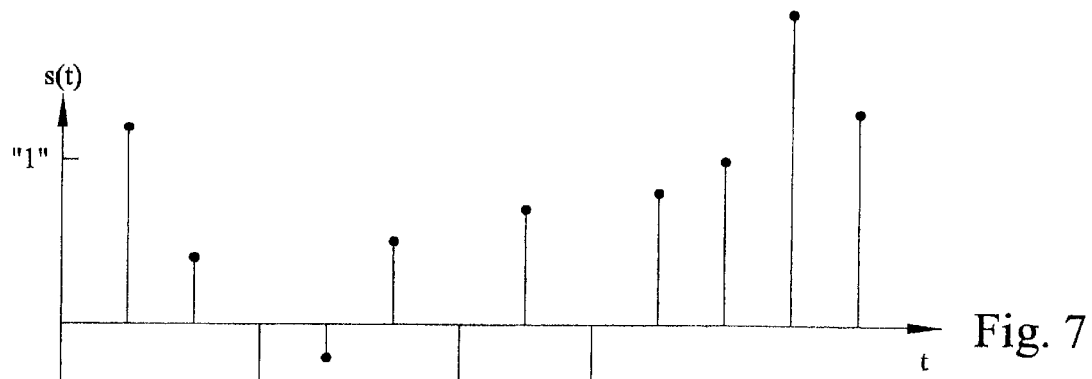
FIG. 7 is a time diagram illustrating an A/D converted digital signal from the interleaved A/D converter in FIG. 6 before decoding.
Figure 8:
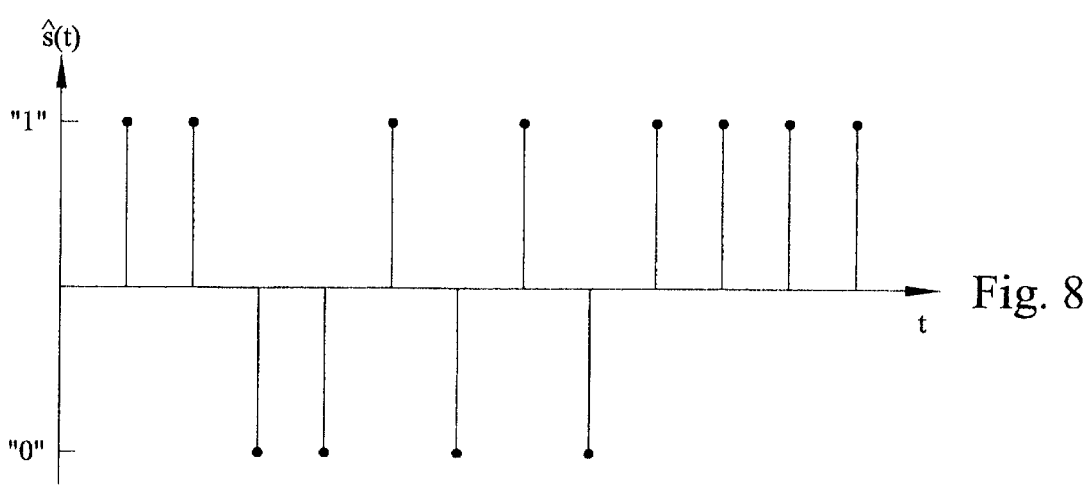
FIG. 8 is a time diagram illustrating the digital signal of FIG. 7 after decoding.
Figure 9:
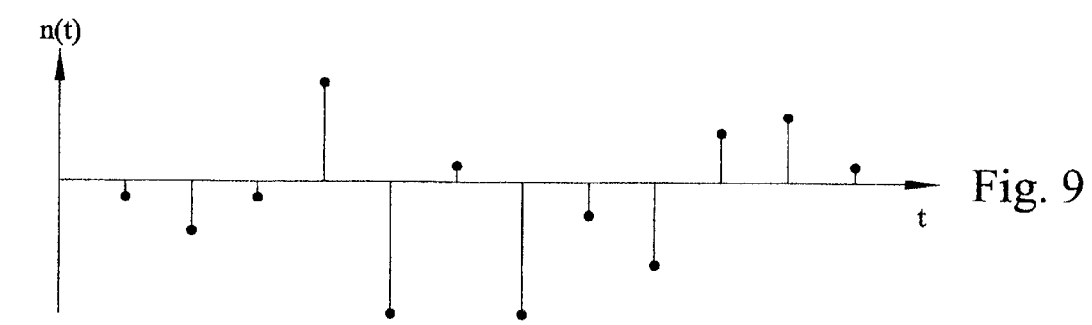
FIG. 9 is a time diagram illustrating the noise part of the digital signal of FIG. 7.
Figure 10:
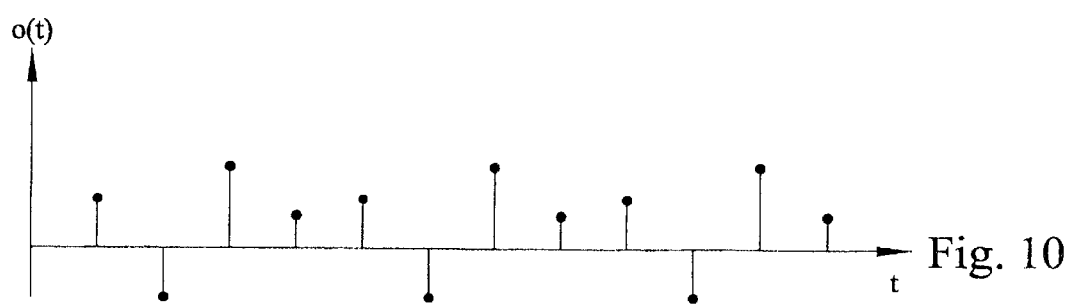
FIG. 10 is a time diagram illustrating the offset error of the digital signal of FIG. 7.

FIGS. 7–10 are similar to FIGS. 1–4. The essential difference is that the offset error o(t) in FIG. 10 is no longer a DC level, as in FIG. 4, since each A/D converter has its own offset error. This leads to a slightly different digital signal s(t) in FIG. 7, as compared to FIG. 1. The decoded signal $\hat{s}(t)$ in FIG. 8 is the same signal as in FIG. 2, and the noise n(t) in FIG. 9 is the same as in FIG. 3. The fact that the decoded signal is the same in FIGS. 2 and 8 should, however, be considered as an exception rather than a rule, since the changed offset signal may change the signal s(t) sufficiently to change the decoding of at least some samples.

Figure 11:
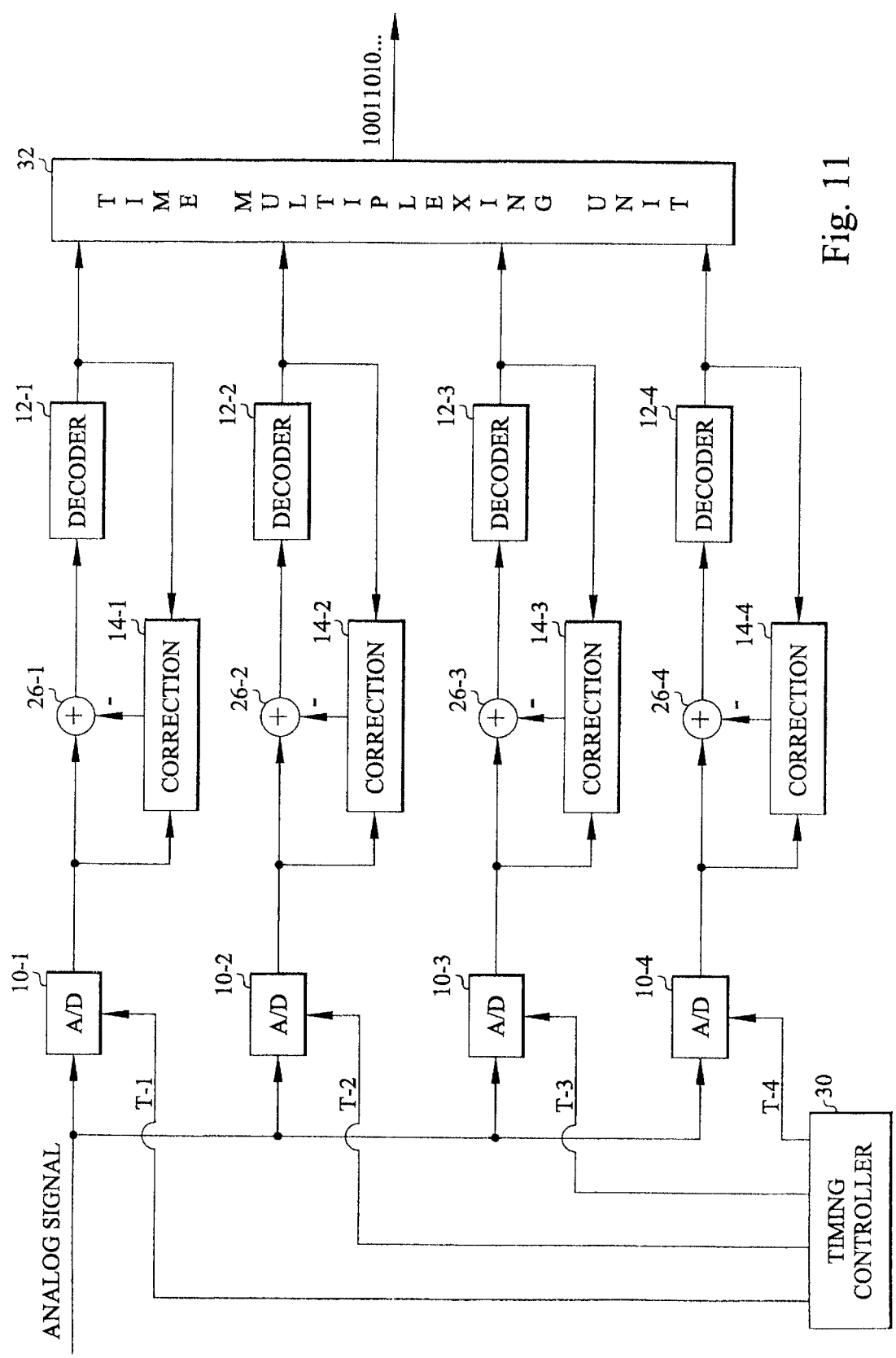
FIG. 11 is a block diagram of an embodiment of an offset error correction arrangement in accordance with the present invention intended for an interleaved A/D converter.

FIG. 11 is a block diagram of an embodiment of an offset error correction arrangement in accordance with the present invention intended for an interleaved A/D converter. In order not to clutter the following figures, an interleaved A/D converter including 4 A/D converting elements is assumed. However, it is appreciated the described principles are valid for any number N of A/D converting elements.

The embodiment of FIG. 11 is a natural generalization of the embodiment in FIG. 5. By providing separate decoders 12-1 . . . 12-4, offset correction units 14-1 . . . 14-4 and adders 26-1 . . . 26-4 for each A/D converting elements 10-1 . . . 10-4, each A/D converting element will obtain a correction that is appropriate for its offset. It is also noted that in this embodiment the time multiplexing unit 32 will multiplex binary signals.

Figure 12:
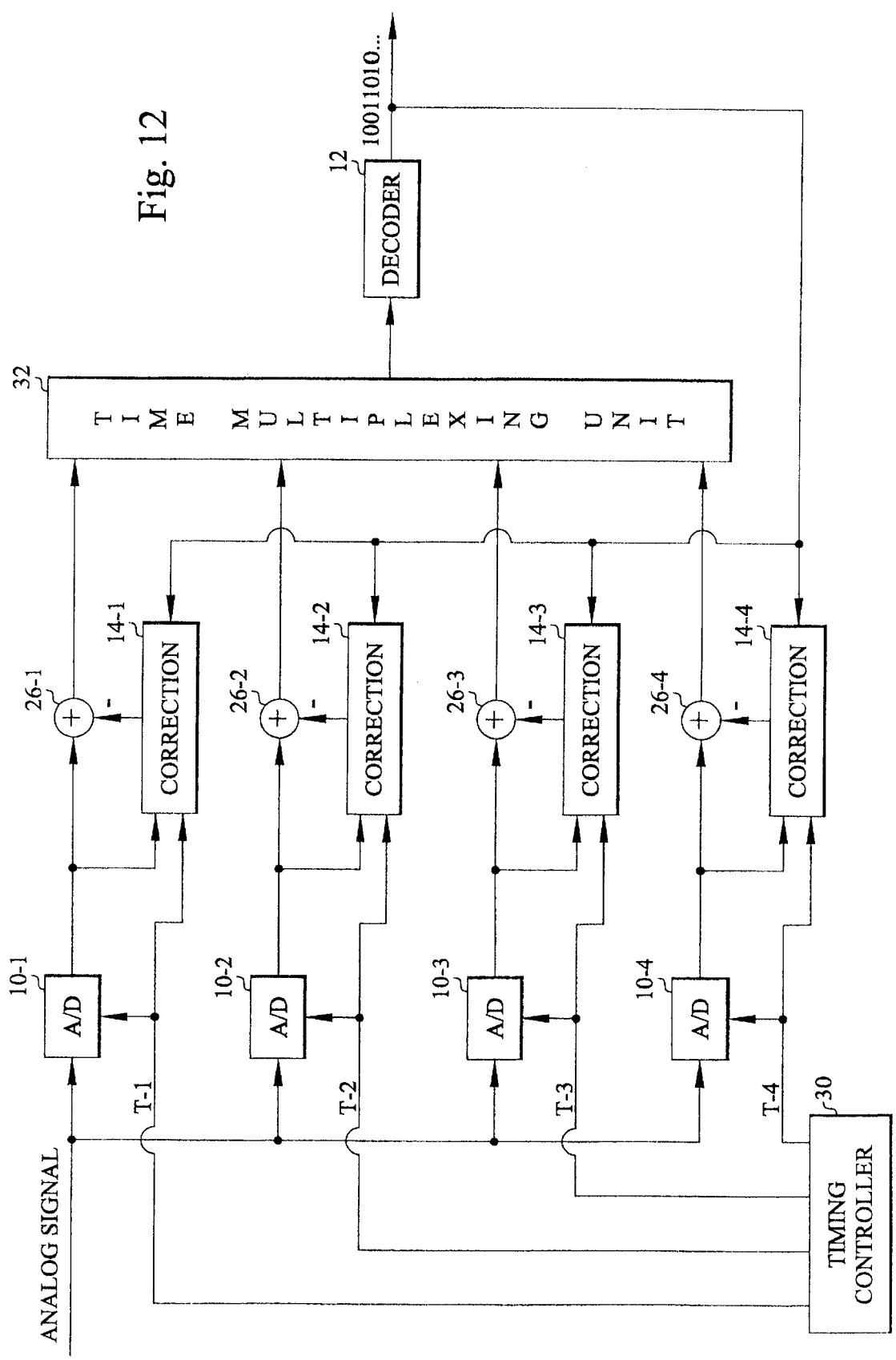
FIG. 12 is a block diagram of another embodiment of an offset error correction arrangement in accordance with the present invention intended for an interleaved A/D converter.

The embodiment of FIG. 11 is somewhat complex, since it requires separate elements 12. 14 and 26 for each A/D converting element. FIG. 12 is a block diagram of another embodiment of an offset error correction arrangement in accordance with the present invention intended for an interleaved A/D converter in which this complexity has been reduced. In this embodiment a common decoder 12 is used to decode the multiplexed digital samples from all A/D converting elements 12-1 . . . 12-4. The decoded signal is forwarded to all correction units 14-1 . . . 14-4. Since there already are timing signals T-1 . . . T-4 available, these signals are used to control the correction units in the same way as the A/D converting elements.

FIG. 13 is a time diagram, similar to FIG. 10 illustrating the mean offset error $\hat{o}$ of the digital signal of FIG. 7. Although each A/D converting element in an interleaved A/D converter has its own offset error, the resulting offset error signal o(t) will be periodic (as indicated in the figure) and have a mean offset $\hat{o}$.

This mean offset represents a DC level or a common offset of the entire converter. If it is considered sufficient to correct only for this DC level, the correction method can be significantly simplified as compared to the embodiments of FIGS. 11–12.

FIG. 14 is a block diagram of an embodiment of an offset error correction arrangement in accordance with the present invention intended for an interleaved A/D converter that corrects only for the mean offset ô. In this case it is possible to use the same arrangement for an interleaved A/D converter as for a non-interleaved A/D converter. Thus, the embodiment of FIG. 14 uses the same offset correction arrangement as the embodiment of FIG. 5. However, it should be remembered that whereas the embodiment of FIG. 5 removes the entire offset error, the embodiment of FIG. 14 only removes the DC level of the offset error signal o(t).

Figure 15:
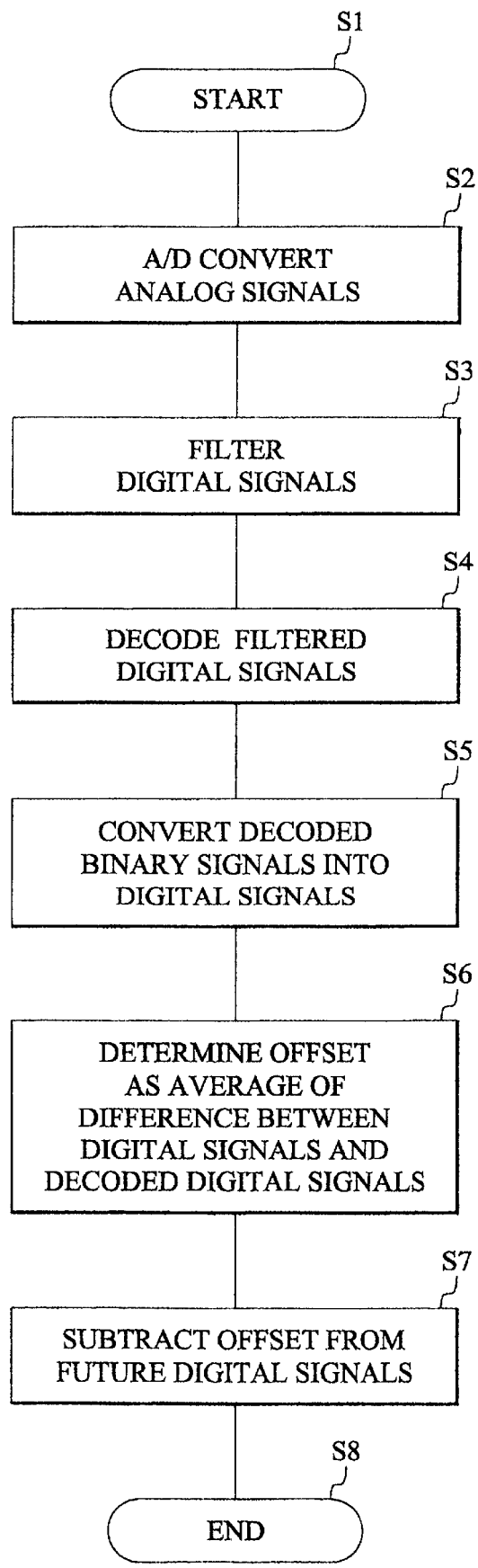
FIG. 15 is a flow chart illustrating an embodiment of the offset error correction method in accordance with the present invention.

FIG. 15 is a flow chart illustrating an embodiment of the offset error correction method in accordance with the present invention. The procedure starts in step S1. Step S2 A/D converts analog signals into digital signals (including the offset error). Step S3 filters the digital signals. Step S4 decodes the filtered digital signals into binary signals. Step S5 converts the decoded binary signals into equivalent digital form. Step S6 determines the offset error by averaging the difference between the A/D converted and filtered digital signals and the decoded digital signals. Step S7 subtracts this offset error from future A/D converted and filtered signals. Step S8 ends the procedure. This procedure may be repeated at regular intervals to account for slow offset changes.

So far the invention has primarily been described with reference to decoding of binary signals, i.e. symbols having a length of 1 bit. However the invention is equally applicable to decoding of symbols including more than one bit, for example QAM (Quadrature Amplitude Modulated) signals. In this case the offset will shift the modulation constellation by an offset vector (an offset for each bit in the symbol).

Figure 16:
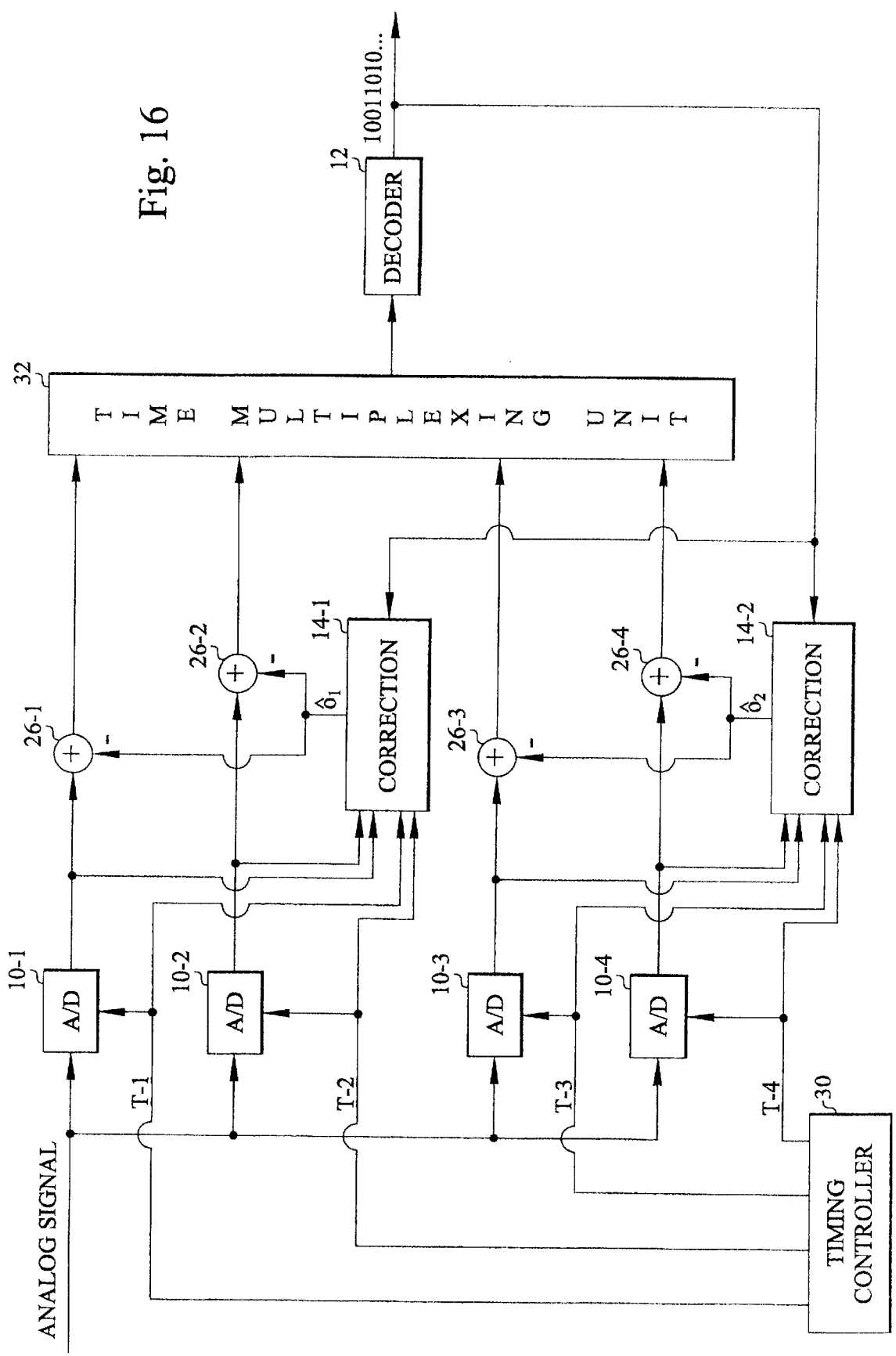
FIG. 16 is a block diagram of a further embodiment of an offset error correction arrangement in accordance with the present invention intended for an interleaved A/D converter.

FIG. 16 is a block diagram of a further embodiment of an offset error correction arrangement in accordance with the present invention intended for an interleaved A/D converter. This embodiment is especially suitable for A/D conversion and decoding of QAM signals in a 4-point constellation. This modulation type requires 2 consecutive bits for each symbol. In the embodiment of FIG. 16, A/D converting elements 10-1 and 10-2 are used to digitize, for example, odd numbered symbols, whereas A/D converting elements 10-3 and 10-4 are used to digitize even numbered symbols. Separate offset corrections ô1 and ô2 are determined for odd and even numbered symbols. Thus, this embodiment lies somewhere between the embodiments of FIGS. 11 and 14.

In FIG. 11 each A/D converting element is offset compensated, whereas in FIG. 14 a common offset is determined for the entire interleaved A/D converter. In FIG. 16 a separate common offset is determined for each pair of A/D converting elements.

Another embodiment of an offset compensated interleaved A/D converter suitable for QAM signals may be based on the embodiment of FIG. 12. In this A/D converter the offset of each A/D converting element is corrected. The difference with respect to the embodiment described in FIG. 12 is that the decoded value of the first bit in each symbol is not known until the entire symbol has been decoded. Thus, the correction method may be summarized as:

1. Decode and separately average errors of A/D converting elements 10-1 and 10-2 for odd symbols in correction units 14-1 and 14-2.
2. Decode and separately average errors of A/D converting elements 10-3 and 10-4 for even symbols in correction units 14-3 and 14-4.

Figure 17:
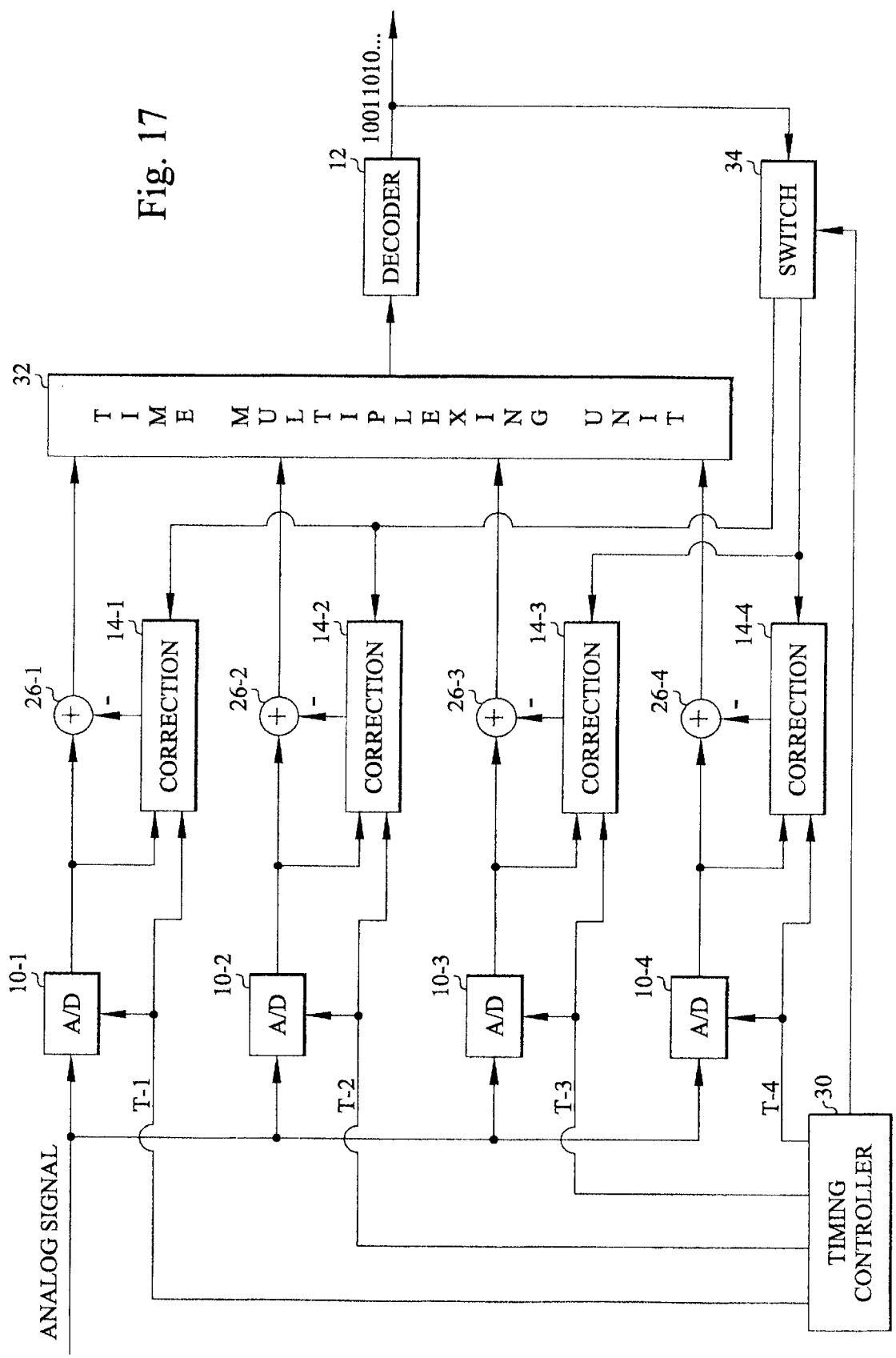
FIG. 17 is a block diagram of another embodiment of an offset error correction arrangement in accordance with the present invention intended for an interleaved A/D converter.

FIG. 17 is a block diagram of an embodiment of an offset error correction arrangement that implements this method. In FIG. 17 a switch 34, controlled by timing controller 30, directs bits of decoded odd symbols to correction units 14-1 and 14-2, and bits of decoded even symbols to correction units 14-4 and 14-4. In this way separate offset correction vectors will be formed for odd and even symbols.

The invention may also be used in multi-carrier systems as for instance DMT (Discrete Multi Tone) modems (ADSL (Asymmetric Digital Subscriber Line) and VDSL (Very high rate Digital Subscriber Line), OFDM (Orthogonal Frequency Division Multiplex) systems (DAB (Digital Audio Broadcasting), DVB (Digital Video Broadcasting), Wlan (Wireless local area network)). In these systems the modulation constellations are also shifted by an offset error vector. In most of the embodiments that will be described an element will be omitted since it is not necessary to explain the principles of the invention. This element is a filter that is provided between the A/D converter and decoder. Such a filter may comprise a lowpass filter, an equalizer or a fast Fourier transformer (FFT).

Figure 18:
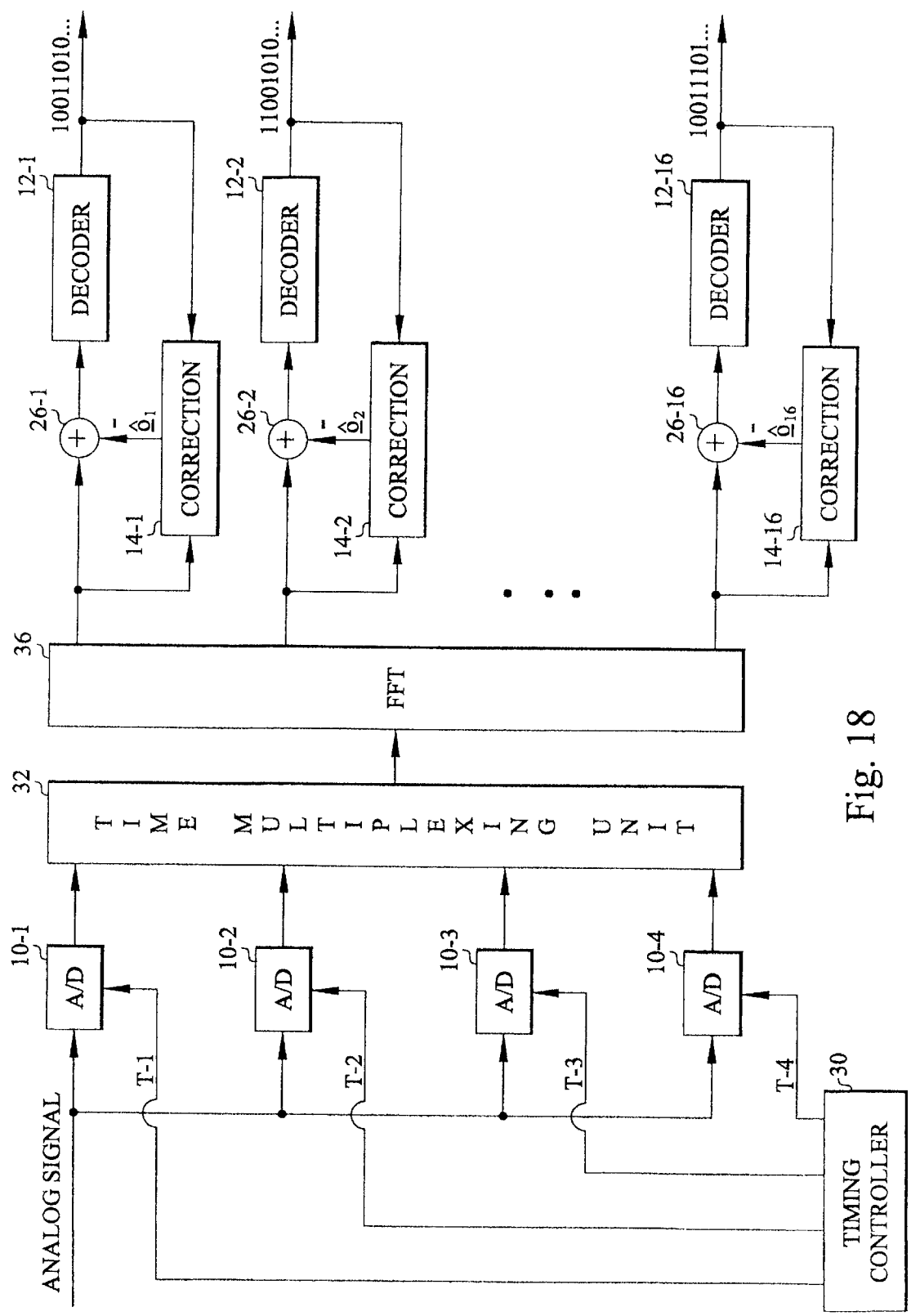
FIG. 18 is a block diagram of still another embodiment of an offset error correction arrangement in accordance with the present invention intended for an interleaved A/D converter.

FIG. 18 is a block diagram of still another embodiment of an offset error correction arrangement in accordance with the present invention intended for an interleaved A/D converter. This embodiment is useful for DMT or OFDM applications. In the embodiment of FIG. 18 an FFT element 36 separates the digital signal into different sub-channels. The figure assumes 16 sub-channels. However, this number has only been selected to illustrate the principles. Typically there will be $2^n$ sub-channels, where n is in the range 4–10. Each sub-channel will have its own decoder and offset correction arrangement. If QAM modulation is assumed, the FFT element 36 will transform 16 symbols into 16 digital Fourier coefficients. Each Fourier coefficient (complex number) will be (vector) offset compensated separately. Since the FFP is a linear operation, it is appreciated that this embodiment will in fact perform a complete offset compensation for all A/D converting elements.

Typically the offset error correction in accordance with the present invention is implemented by one or several microprocessors or micro/signal processor combinations and corresponding software.

The present invention has the following advantages:
1. It is capable of solving the offset matching problem in interleaved A/D converters (different A/D converting elements having different offsets).
2. It is a purely digital method, which means that no extra noise is added the signals.
3. No training sequence is required.
4. The transmission capacity may be increased, since the reduced offset error implies a higher SNR.
5. The method will in fact also compensate for DC offsets in a D/A converter on the transmitter side.

It will be understood by those skilled in the art that various modifications and changes may be made to the present invention without departure from the scope thereof, which is defined by the appended claims.

REFERENCES

[1] U.S. Pat. No. 4,968,988 (Takahiro Miki et. al.)
[2] U.S. Pat. No. 5,585,796 (Christer M. Svensson et. al.)

What is claimed is:
1. An A/D conversion offset error correction method, including the steps of
 converting analog signals into digital signals;
 filtering said digital signals;
 decoding said filtered digital signals into binary signals;
 converting said binary signals into equivalent decoded digital signals;
 forming an offset error estimate by averaging the difference between said filtered digital signals and said decoded digital signals; and subtracting said offset error estimate from future filtered digital signals before decoding.

2. An A/D conversion offset error compensated decoding method, including the steps of converting analog signals into digital signals;

filtering said digital signals;

decoding said filtered digital signals into binary signals;

converting said binary signals into equivalent decoded digital signals;

forming an offset error estimate by averaging the difference between said filtered digital signals and said decoded digital signals;

subtracting said offset error estimate from future filtered digital signals, thereby producing offset error corrected digital signals; and decoding said offset error corrected digital signals.

3. The method of claim 1 or 2, wherein each A/D converting element in an interleaved A/D converter is individually offset error corrected.

4. The method of claim 1 or 2, wherein groups of A/D converting element in an interleaved A/D converter are individually offset error corrected.

5. The method of claim 1 or 2, wherein each A/D converting element in an interleaved A/D converter is offset error corrected by the same estimated offset error.

6. The method of claim 1 or 2, including the further step of continuously updating said offset error estimate.

7. The method of claim 1 or 2, including the further step of regularly repeating said averaging step.

8. The method of claim 1 or 2, wherein said filtering step involves fast Fourier transformation of said digital signals.

9. An A/D conversion offset error correction arrangement, including means for converting analog signals into digital signals;

means or filtering said digital signals;

means for decoding said filtered digital signals into binary signals;

means for converting said binary signals into equivalent decoded digital signals;

means for forming an offset error estimate by averaging the difference between said filtered digital signals and said decoded digital signals; and means for subtracting said offset error estimate from future filtered digital signals before decoding.

10. An A/D conversion offset error compensated decoding arrangement, including means for converting analog signals into digital signals;

means for filtering said digital signals;

means for decoding said filtered digital signals into binary signals;

means for converting said binary signals into equivalent decoded digital signals;

means for forming an offset error estimate by averaging the difference between said filtered digital signals and said decoded digital signals;

means for subtracting said offset error estimate from future filtered digital signals, thereby producing offset error corrected digital signals; and means for decoding said offset error corrected digital signals.

11. The arrangement of claim 9 or 10, including means for individually offset error correcting each A/D converting element in an interleaved A/D converter.

12. The arrangement of claim 9 or 10, including means for individually offset error correcting groups of A/D converting element in an interleaved A/D converter.

13. The arrangement of claim 9 or 10, including means for offset error correcting each A/D converting element in an interleaved A/D converter by the same estimated offset error.

14. The arrangement of claim 9 or 10, including means for continuously updating said offset error estimate.

15. The arrangement of claim 9 or 10, including means for regularly repeating said averaging step.

16. The arrangement of any of the preceding claims 9–14, wherein said filtering means includes means for fast Fourier transformation of said digital signals.

* * * * *